United States Patent [19]

Hochberg et al.

[11] 3,898,594

[45] Aug. 5, 1975

[54] MICROWAVE SEMICONDUCTOR DEVICE PACKAGE

[75] Inventors: Arthur Kenneth Hochberg, Torrance; Richard Edward Hejmanowski, Cypres, both of Calif.

[73] Assignee: TRW Inc., Los Angeles, Calif.

[22] Filed: Nov. 2, 1973

[21] Appl. No.: 412,486

[52] U.S. Cl. ............ 333/97 R; 174/DIG. 3; 357/80; 357/81

[51] Int. Cl. ............................ H01l 1/14; H01p 1/00

[58] Field of Search ....................... 333/84 M, 97 R; 174/DIG. 3; 317/234 G, 234 H

[56] References Cited

UNITED STATES PATENTS

| | | | |
|---|---|---|---|
| 2,817,048 | 12/1957 | Thuermel et al. | 317/234 G |
| 3,387,190 | 6/1968 | Winkler | 317/234 G |
| 3,651,434 | 3/1972 | McGeough | 333/84 M |
| 3,663,868 | 5/1972 | Noguchi et al. | 317/234 G |
| 3,801,881 | 4/1974 | Anazawa | 317/234 H |

*Primary Examiner*—Alfred E. Smith
*Assistant Examiner*—Wm. H. Punter

[57] ABSTRACT

A package or mounting structure for hermetically sealing and supporting a microwave semiconductor device adapted for use with stripline transmission lines. A multilayer structure is assembled upon a conductive header, the elements of the multilayer structure having metallized surfaces thereon for providing contact to the microwave semiconductor device. The input and output leads to the mounting structure are adapted for use with strip transmission line configurations, the multilayer structure providing electrical and thermal conductive paths and including internal surface area for mounting microwave semiconductor devices and impedance matching components.

7 Claims, 7 Drawing Figures

MICROWAVE SEMICONDUCTOR DEVICE PACKAGE

BACKGROUND OF THE INVENTION

1. Field of the Invention

The present invention generally relates to semiconductor mounting structures and, more specifically, to those mounting structures adapted for use with microwave semiconductor devices.

2. Prior Art

The application of semiconductor devices for operation at high frequencies has greatly increased as the properties of heat dissipation, size and other characteristics of the devices have been improved to meet the exacting criteria required for such applications. The term "high frequency" as used herein shall hereinafter be understood to typically mean frequencies in the range of 2–4 gigahertz and higher. Although the scope of the present invention mounting structure to be defined hereinbelow is preferably employed at high frequencies, the scope of the present invention includes application at lower electrical frequencies.

The physical characteristics of the mounting structures disclosed by the prior art typically result in poor operation of the semiconductor devices at high frequencies. The devices disclosed in the prior art exhibit poor operation at high frequencies and at high power levels. Typical problems arising in those devices disclosed in the prior art are parasitic or spurious oscillations, cross-talk between elements, unwanted harmonic distortion, inadequate isolation between input and output circuits, lack of space for impedance matching elements and the inability to perfect a hermetic seal. When operating at high frequency and high power levels, the inadequate properties exhibited by those devices disclosed in the prior art can be improved by proper selection of the structure of the mounting package as well as proper selection of the topological geometry of the semiconductor elements and the lead metallization patterns.

A typical device disclosed by the prior art for use with microwave devices utilizes a multilayer, hermetically sealed package requiring a number of electrically coupled metallized surfaces for providing a common potential barrier about the semiconductor device. The configuration of the metallized surfaces must be altered to adapt to the particular semiconductor element or configuration being utilized thereby requiring a complex process for disposing the metallized layers upon the elements of the structure. The deposition process must be altered based upon the selection of the semiconductor device thereby creating a number of process steps which unduly complicate fabrication of the strucure.

Other devices disclosed by the prior art exhibit a number of problems which are sought to be resolved by the structure of the present invention package. The disposition of the semiconductor device requires excessive lead lengths and distances to the ground plane which degrades the operation of the device when it is operating at high frequencies. In addition, spurious or parasitic oscillations can arise because some part of the output signal of the device is being inadvertently fed back to the input of the circuit. Feedback may occur through interlead capacitances, excessive lead inductance, stray wiring inductance and capacitance, etc., the exact path often being difficult to determine. At all frequencies, the energy at the input and output of the circuit is between the conductor and the ground plane, but, in many of the devices disclosed in the prior art, the input signal to the circuit can be coupled to the output at high frequencies through the dielectric member used to support the semiconductor device.

The present invention structure substantially resolves the problems inherent in those devices disclosed by the prior art. The present invention mounting structure comprises a multilayer assembly which is fabricated upon a conductive header. The multilayer assembly includes a metallized dielectric member which is adapted to provide sufficient space for mounting impedance matching elements within the hermtetically sealed cavity as well as reducing the lead lengths required to connect the regions of the semiconductor device to the conductive surfaces and ultimately to the terminals of the mounting structure. The present invention structure provides facilities for proper connection to substantially all conventional microwave semiconductor devices.

SUMMARY OF THE INVENTION

The present invention constitutes an improved hermetically sealed package for semiconductor devices operating at microwave frequencies. A conductive header adapted to be interfaced with stripline circuit is the base for the present invention mounting structure. A thermally conductive, electrically isolating member is used as the base for the semiconductor device and any impedance matching members which are utilized therewith. The top, bottom and a portion of the side surfaces of the thermally conductive member receive metallizing layers whereby the top surface thereof encloses a pair of spaced regions which are isolated from each other and the remaining metallized surface. The bottom surface of the thermally conductive member is metallized providing a pair of isolated metallized regions which are in electrical communication with the pair of isolated metallized regions on the top surface thereof. To reduce excessive lead length, aligned apertures are disposed through the metallized layers and thermally conductive member from the top to the bottom surface thereof, the apertures being metallized to provide for an electrical communication path between the respective metallized regions on the top and bottom surface of the thermally conductive member.

The pair of isolated metallized regions on the bottom surface of the thermally conductive member are adapted to receive stripline tabs for making electrical contact to the present invention mounting structure, the tabs or contact leads being adapted to be in a planar relationship with respect to each other.

The interior cavity of the present invention mounting structure is defined by the thermally conductive member and a sealing member therefor, the interior cavity created by the defined members providing a sufficient surface to include necessary impedance matching members within the hermetically sealed cavity. The semiconductor device used with the present invention structure is mounted upon one of the isolated metallized layers on the top surface of the thermally conductive member. Since the metallized thermally conductive member provides at least two isolated metallized pads, the active regions of the semiconductor device can be connected to one or more impedance matching members or related devices which are properly interconnected with the contact leads as well as the conductive header of the mounting structure.

The multilayer mounting structure provides means for hermetically sealing a high frequency, semiconductor device as well as impedance matching members within an internal cavity of the mounting structure. In addition, stripline contacts for the input and output circuits of the package are connected in a common plane thereby equalizing the impedance between the ground plane and the input and output of the respective circuits.

It is therefore an object of the present invention to provide an improved mounting structure for microwave semiconductor devices.

It is another object of the present invention to provide a mounting structure for semiconductor devices which includes a hermetically sealed cavity capable of including impedance matching members.

It is still another object of the present invention to provide a mounting structure for semiconductor devices having improved isolation between input and output circuits.

It is yet another object of the present invention to provide a mounting structure for microwave, semiconductor devices which is economical and simple to fabricate.

The novel features which are believed to be characteristic of the invention, both as to its organization and method of operation, together with objectives and advantages thereof, will be better understood from the following description considered in connection with the accompanying drawing in which a presently preferred embodiment of the present invention is illustrated by way of example. It is to be expressly understood, however, that the drawing is for the purpose of illustration and description only, and is not intended as a definition of the limits of the invention.

DESCRIPTION OF THE PRESENTLY PREFERRED EMBODIMENT

Figure 1:
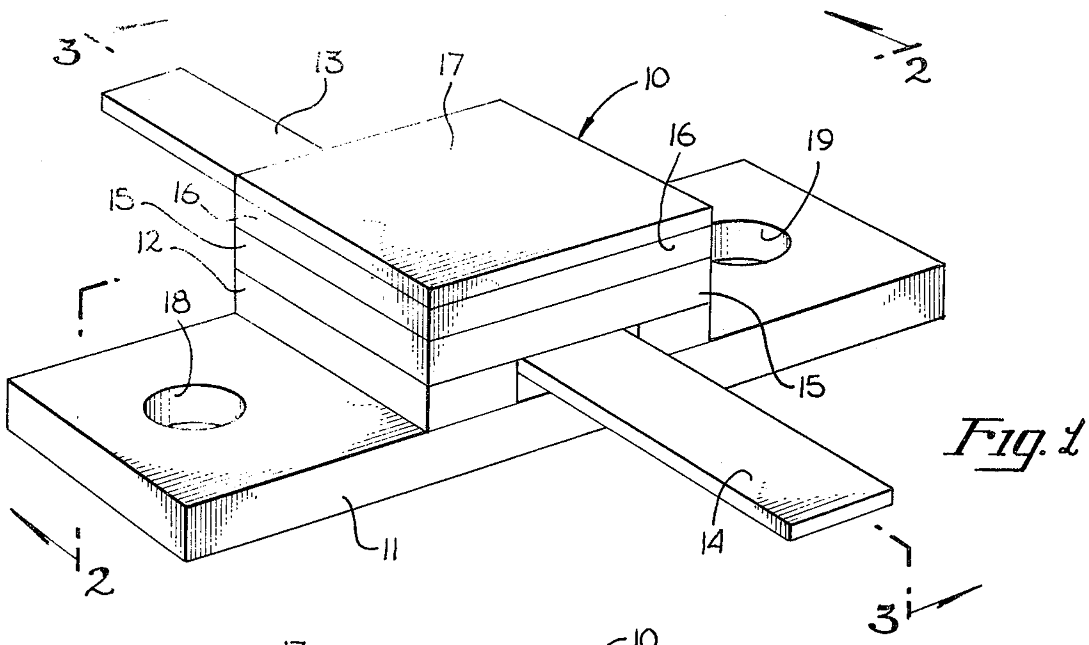
FIG. 1 is a perspective view of a microwave packaging structure in accordance with the present invention.

An understanding of the present invention mounting structure can be best gained by reference to FIG. 1 wherein a perspective view of an assembled package is shown therein, the package being generally designated by the reference numeral 10. It is to be noted that because of the actual size of the present invention, and for the ease of explanation, the present invention mounting structure shown in the drawing is typically illustrated in an expanded size. All metallized layers disposed on one or more of the members of the present invention mounting strcture are illustrated with exaggerated thicknesses, it being understood that the conductive or metallized layers are very thin, the dimensions shown being for the purpose of illustration only.

The present invention mounting structure 10 is adapted for use with high frequency semiconductor devices. The present invention package 10 is an assembly of stratified elements, the base element being conductive header 11. The first member to be mounted upon conductive header 11 is conductive spacer 12 which provides apertures for the mounting of contact leads 13 and 14. Metallized, thermally conductive member 15 is mounted spacer 12 which, as is stated, is mounted upon conductive header 11, metallized, thermally conductive member 15 being adapted to receive the microwave, semiconductor device as well as necessary impedance matching members. Metallized, thermally conductive member 15 will be described in detail hereinbelow. As previously stated, an object of the present invention is to provide a hermetically sealed chamber for enclosing the semiconductor device as well as all impedance matching members which are utilized with the present invention mounting structure 10. The top surface of metallized, thermally conductive member 15 forms the base for the hermetically sealed cavity, spacer 16 and sealing cap 17 providing the remaining boundaries of the hermetically sealed cavity. The present invention mounting structure is adapted to be utilized within stripline circuits and therefore conductive header 11 is provided with mounting apertures 18 and 19 to facilitate the utilization of the present invention mounting structure 10 within a general circuit configuration.

Figure 2:
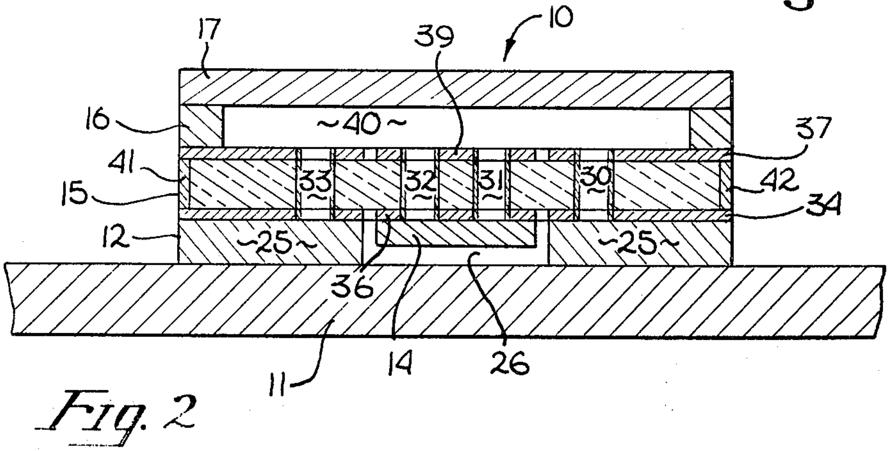
FIG. 2 is a cross-sectional, assembly view of the present invention packaging structure taken through line 2—2 of FIG. 1.
Figure 3:
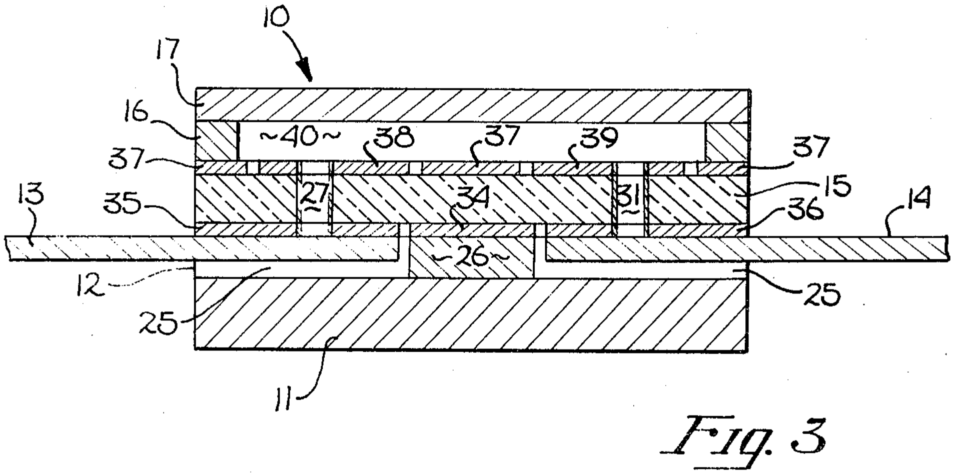
FIG. 3 is a cross-sectional, assembly view of the present invention packaging structure shown in FIG. 1 taken through line 3—3 of FIG. 1.

The general structure of the present invention mounting structure 10 can be best seen by reference to FIG. 2 and FIG. 3 which illustrate cross-sectional assembly views of mounting structure 10, the assembly shown in FIG. 2 and FIG. 3 being illustrated without the inclusion of any semiconductor device or impedance matching elements. Conductive header 11 is preferably constructed of oxygen-free, high conductivity copper. The use of oxygen-free, high conductivity copper is preferred because the fabrication of the present invention mounting strcture 10 is typically carried out by utilizing a brazing process in a reducing atmosphere or one of conventional forming gas. The presence of oxygen in the copper at the time of brazing could result in a reaction whereby copper would swell and produce brazing voids therein. The presence of brazing voids within conductive header 11 would result in degraded thermal, electrical and hermetic characteristics of the mounting structure 10. Although the preferred form of conductive header 11 is oxygen-free, high conductivity copper, other suitable electrically conducting materials could be utilized. It is also to be noted that spacers 12 and 16 as well as sealing cap 17 are also preferably fabricated of oxygen-free, high conductivity copper. The fabrication of these elements with the specified material generally follows the explanation set forth hereinabove. It is to be noted that spacer 16 and sealing cap 17 could be fabricated from a suitable metallized ceramic through the utilization of conventional bonding processes.

Spacer 12 is a conductive member mounted upon the top surface of conductive header 11, spacer 12 having a pair of spaced, parallel members 25 extending transverse to conductive header 11, members 25 being joined by cross-member 26. The apertures formed by the surfaces of members 25, conductive header 11 and metallized, thermally conductive member 15 are adapted to receive the ends of contact leads 13 and 14. This is best shown in FIG. 3.

Figure 4:
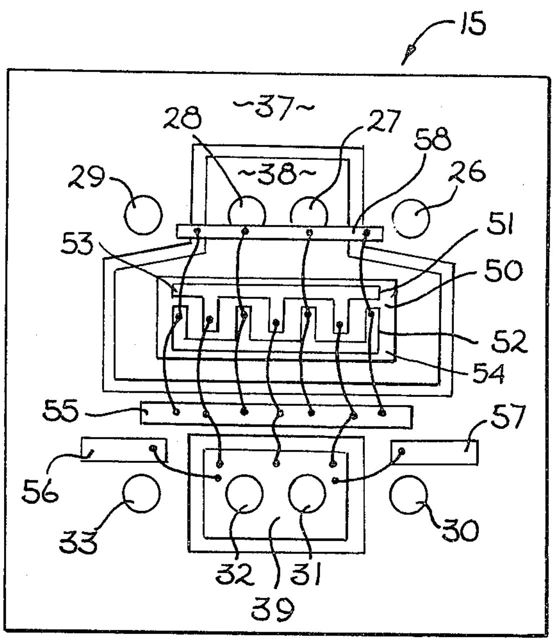
FIG. 4 is a top plan view of the thermally conductive member shown in FIG. 1 with an exemplary circuit connected thereto.
Figure 5:
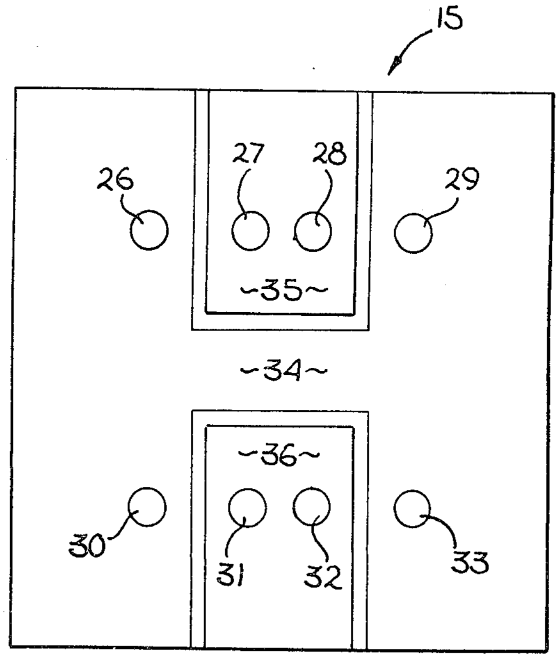
FIG. 5 is a bottom plan view of the thermally conductive member shown in FIG. 1.

Metallized, thermally conductive member 15 can be best seen by reference to FIGS. 2, 3, 4 and 5. Metallized, thermally conductive member 15 is secured to the top surface of spacer 12. Metallized, thermally conductive member 15 is an electrically insulating, thermally conductive member which is preferably fabricated of a ceramic such as berrilyum oxide having grain size of less than 30 micrometers. The use of a member having grain size of less than 30 micrometers will minimize voids between the grains. Excessive void size can entrap gasses during the metallization processes. Any entrapped gas may bubble and break through the metallized layers during subsequent high temperature processing. In addition, voids will increase the thermal impedance from a mounted semiconductor device and impedance matching element to the heat sink provided by thermally conductive member 11. In addition, large void concentrations may provide a leakage path therethrough thus deteriorating the hermetic characteristics of the present invention mounting structure 10. The top, bottom and two of the side surfaces of ceramic member 15 are metallized utilizing conventional process steps such as vacuum evaporation, sputtering, etc. Apertures 26, 27, 28, 29, 30, 31, 32 and 33 are disposed through ceramic member 15 from the top to the bottom surface thereof. As shown in FIG. 4 and FIG. 5, two groups of apertures are disposed through ceramic member 15, the first group comprising apertures 26 – 29, the second group comprising apertures 30 – 33. Each group of apertures defines a linear alignment, the linear alignment of each group being in parallel, spaced relation to the other group of apertures. The metallized layers disposed on the top and bottom surfaces of ceramic member 15 include the walls of the contiguous apertures 26 – 33 which are integral to the described metallized layers. The bottom surface has metallized layers 34, 35 and 36 disposed thereon. Metallized layers 35 and 36 are adjacent the edges of ceramic member 15, metallized layer 34 being a substantially H-like configuration. The indentations in metallized layer 34 bound metallized layers 35 and 36, metallized layers 35 and 36 being electrically isolated from metallized layer 34.

The top surface of ceramic member 15 has metallized layers 37, 38 and 39 disposed thereon, metallized layers 38 and 39 being surrounded by respective portions of metallized layer 37. Metallized layer 39 is contiguous with apertures 31 and 32, the metallized surfaces of apertures 31 and 32 providing electrical contact between metallized layer 39 and metallized layer 36. Metallized layer 38 is contiguous with apertures 27 and 28, the metallized surface of apertures 27 and 28 providing for electrical communication between metallized layer 38 and metallized layer 35. In a like manner, the metallized surfaces of apertures 26, 29, 30 and 33 provide for electrical communication between metallized layer 37 and metallized layer 34. It is also to be noted that to facilitate electrical communication between metallized layer 37 and metallized layer 34 on the top and bottom surfaces of ceramic member 15 respectively, metallized layers 41 and 42 are disposed on the side surfaces of ceramic member 15 intermediate layers 34 and 37.

As stated previously, the bottom surface of ceramic member 15 is disposed upon and secured to the top surface of spacer 12. The respective members 25 and 26 of spacer 12 are aligned with the similarly shaped portions of metallized layer 34 providing for electrical contact between metalized layer 34 and spacer 12. As can be seen in FIG. 2 and FIG. 3, contact lead 14 is secured to an electrical contact with metallized layer 36, and via metallized aperture 31 and 32 is in electrical contact with metallized layer 39. As can be best seen in FIG. 3, contact lead 13 is secured to metallized layer 35 on the bttom surface of ceramic member 15, contact lead 13 being in electrical contact with metallized layer 38 via the metallized surfaces of apertures 27 and 28. The manner of securing a microwave, semiconductor device and any necessary impedance matching element to metallized, ceramic member 15 will be described in detail hereinbelow.

As stated previously, one of the objectives of the present invention is to provide a hermetic cavity within which to enclose the microwave semiconductor device as well as any necessary impedance matching elements. Spacer 16 is disposed upon and secured to the top surface of ceramic member 15, spacer 16 being in electrical contact with metallized layer 37 along the periphery thereof. As can be seen in FIG. 2 and FIG. 3, the spacer 16 is in contact with only metallized layer 37 and provides the upwardly depending wall section of the required hermetic cavity 40. Cavity 40 is ultimately formed by the disposition of sealing cap 17 upon spacer 16. Therefore, hermetic cavity 40 is formed by the sealing of ceramic member 15, spacer 16 and sealing cap 17.

The metallized layers on ceramic member 15 are singular or multilayers of electrically conductive material. Although the metallized layers disposed on upon ceramic member 15 can be a singular layer of suitable contact metal such as gold, the preferred form of the present invention utilizes a multilayer construction to improve adherence of the metallization to ceramic member 15. Improper choice of the metallized layers can cause interdiffusion of the metal layer or layers which can decrease the conductivity of the top metal layer. Typical multilayer combinations are as follows: titanium, tungsten, gold; titanium, platinum, gold; titanium, paladium, gold; titanium, nickel, gold; titanium, platinum, silver. In all cases illustrated hereinabove, the titanium layer is the first layer disposed upon the ceramic member, the gold or silver being the layer to which contact is made.

A typical microwave semiconductor circuit utililzed with the present invention mounting structure is shown in FIG. 4. It is to be noted that the circuit illustrated in FIG. 4 is for the purpose of illustration only, the scope of the present invention mounting structure being independent of the type of semiconductor device used therewith. Transistor chip 50 is thermally and electrically secured to metallized layer 38. As stated, transistor chip 50 is exemplary of the microwave semiconductor devices which can be used with the present invention mounting structure 10. In this case, the body of transistor chip 50 is the collector region of transistor chip 50, the base and emitter regions being properly disposed within the body of transistor chip 50. For the purpose of example, the emitter region is designated by the reference numeral 51 and the base region is designated by the reference numeral 52. Emitter and base leads 53 and 54 respectively are interdigitated utilizing the topological geometry of transistor chip 50. It is, of course, understood that the semiconductor device represented by transistor chip 50 could utilize substantially all other forms of semiconductor devices, only the connections between the semiconductor device and the present invention package 10 being altered.

The exemplary circuit illustrated in FIG. 4 utilizes passive elements 55, 56 and 57 to illustrate the mounting of impedance matching elements within the hermetic cavity 40 of the present invention mounting structure 10. The exemplary circuit shown in FIG. 4 provides for connection between base region 52 and passive element 55 as well as showing the connections between emitter region 51, passive element 55 and metallized layer 39. In addition, passive elements 56 and 57 are shown as being disposed intermediate and connected to metallized layers 39 and 37.

The flexibility of the present invention mounting structure is illustrated by the ability to utilize staple 58 to reduce the length of base leads 34. The ends of staple 58 are in electrical contact with metallized layer 37, the intermediate portion of staple 58 spanning the gap between the connections to metallized layer 37 to provide for a shortened distance between base region 52 and a location to make electrical contact with metallized layer 37. Although the circuit illustrated in FIG. 4 utilizes staple 58, it is, of course, understood that direct contact can be made to metallized layer 37.

If the typical circuit illustrated in FIG. 4 is implemented within the present invention mounting structure 10, conductive header 11 and contact leads 13 and 14 will be in electrical contact with the active regions of transistor chip 50. The collector region of transistor chip 50 is in electrical contact with metallized layer 38 and via the metallized surfaces of apertures 27 and 28 it is in electrical contact with metallized layer 35. As shown in FIG. 3, contact lead 13 is in electrical contact with metallized layer 35 and therefore contact lead 13 provides for electrical connection to the collector region of transistor chip 50. In a like manner, the emitter region 51 of transistor chip 50 is connected to metallized layer 39 through an impedance matching element represented by element 55. Metallized layer 39 is in electrical contact with metallized layer 36 via the metallized surfaces of apertures 31 and 32 and therefore it is in electrical contact with contact leads 14. In the configuration shown in FIG. 4, the base region 52 of transistor chip 50 is electrically connected to metallized layer 37 and metallized layer 34 via the metallized surfaces of apertures 26, 29, 30 and 33. Metallized layer 34 is in electrical connection with conductive header 11 via spacer 12, therefore, conductive header 11 will provide for electrical contact to the base region of transistor chip 50. As stated previously, the strip line contacts 13 and 14 for the input and output circuits for the present invention package are connected in a common plane and thereby equalize the impedance between the ground plane and the input and output of the respective circuits. In the configuration shown in FIG. 4, base region 52 is electrically connected to conductive header 11 which would comprise the ground plane for the circuit shown. Strip line contacts 13 and 14 being in a common plane thereby equalizing the impedance between themselves and conductive header 11, i.e., the ground plane.

Figure 7:
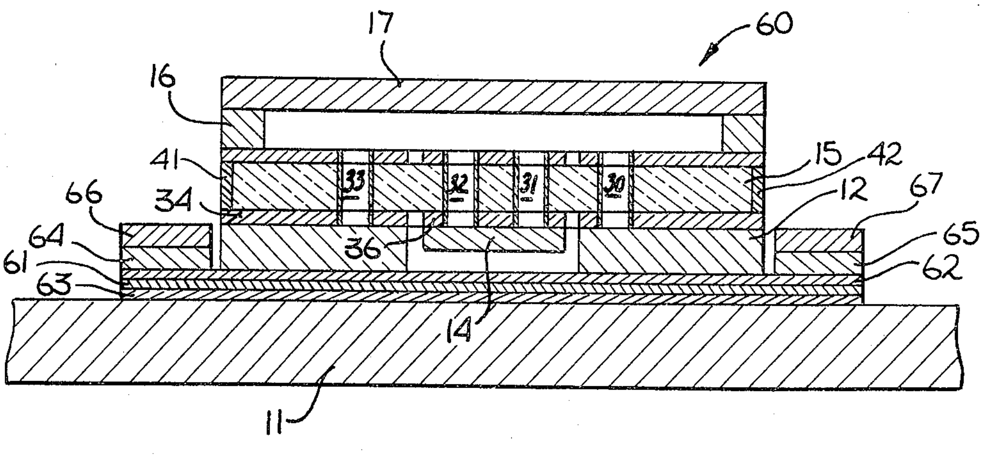
FIG. 7 illustrates a cross-sectional, assembly view of an alternative embodiment of the present invention packaging structure for providing planar lead contacts.

An alternate form of the present invention mounting structure can be best seen in FIG. 7, the mounting structure shown therein being generally designated by the reference numeral 60. For the purpose of clarity and ease of explanation, elements shown in FIG. 7 which correspond elements to those shown in FIGS. 1, 2 and 3 shall be given like reference numerals. The form of the present invention mounting structure 60 shown in FIG. 7 is utilized where circuit requirements make it necessary to isolate the base region of the semiconductor device from conductive member 11 which acts as a heat sink. As in the case of mounting structure 10 shown in FIGS. 1, 2 and 3, spacer 12, metallized ceramic member 15, spacer 16 and sealing cap 17 are stratified as shown in FIG. 7. Contact lead 14 is connected to and in electrical connection with metallized layer 36 which will constitute the emitter lead if a semiconductor device is mounted as shown in FIG. 4. In order to isolate a region of a semiconductor device, typically the base lead from conductive header 11, thermally conductive, electrically insulating member 61 is metallized on the top and bottom surfaces thereof to provide for metallized layers 62 and 63. The thermally conductive, electrically insulating member 61 is preferably fabricated from BeO and has a thickness of approximately 5 mils. Metallized ceramic member 61 is inserted intermediate conductive header 11 and spacer 12, metallized layer 62 being secured to and in electrical contact with header 12, metalized layer 63 being secured to and in electrical with conductive header 11. Conductive spacers 64 and 65 are connected to metallized layer 62 of metallized ceramic member 61, base contact leads 66 and 67 being connected to spacers 64 and 65 respectively. Since base leads 66 and 67 are in electrical communication with metallized layer 34, the configuration of the semiconductor device shown in FIG. 4 will result in contact leads 66 and 67 being in electrical contact with the base region of the semiconductor device. As can be seen in FIG. 7, the contact leads 66 and 67 are in a planar relationship with contact leads 13 and 14 thereby allowing for easy interface with stripline circuitry and meeting an objective of the alternative form of the present invention to substantially equalize the impedance between the ground plane and the input and output of the respective circuits.

Figure 6:
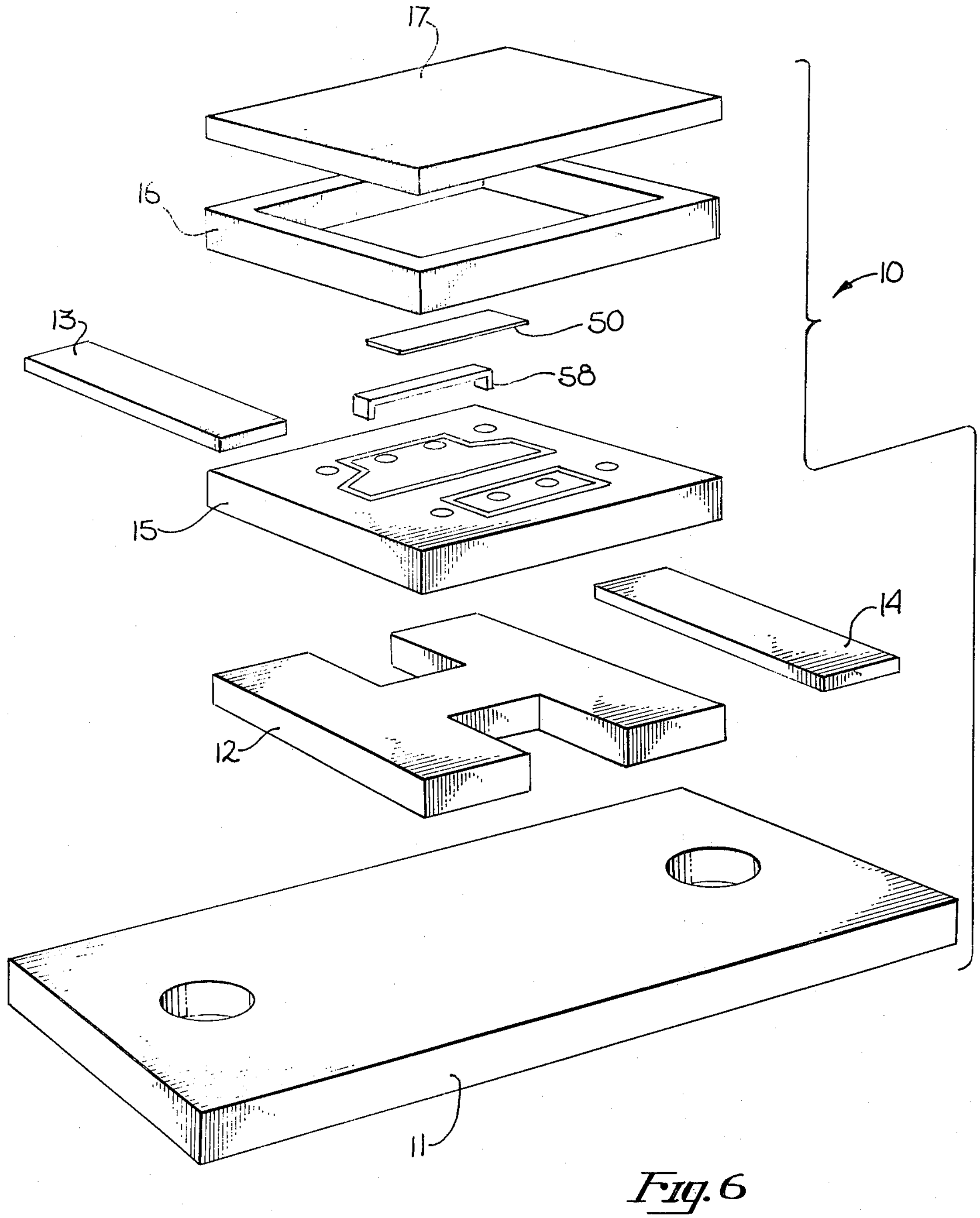
FIG. 6 is an exploded, assembly view of a form of the present invention illustrating the stratified elements thereof.

An understanding of the fabrication of the present invention mounting structure can be best seen by reference to FIG. 6 where an exploded, assembly view of the present invention mounting structure 10 can be best seen. Conductive header 11, spacer 12, contact leads 13 and 14, metallized ceramic member 15 and spacer 16 are mounted in a carbon block, the carbon block having a suitable profile and configuration which is adapted to align all of the stratified members. Preforms of an appropriate brazing material are placed intermediate each of the aligned members which are to be secured to one another. The preforms are configured in substantially the same shape as the desired contact areas between the respective members. Although any suitable brazing material can be utilized, the preferred brazing material is a BT braze which has a melting point of approximately 800° C. The aligned members 11, 12, 13, 14, 15 and 16 are held in place by weights or clamping devices. The temperature cycle and atmosphere which are utilized are commensurate with the particular brazing material being utilized. After brazing, the aligned structure may be gold plated to add a top metal layer and/or to place a protective layer over the copper used to fabricate conductive header 11, spacer 12, spacer 16, etc. Once members 11, 12, 13, 14, 15 and 16 have been secured to one another, transistor chip 50, staple 58 and any other active or passive impedance matching members secured to the top surface of metallized, ceramic member 15. After the circuit is fabricated typically in accordance with the exemplary circuit shown in FIG. 4, sealing cap 17 is secured to spacer 16 by a suitable brazing or soldering procedure thereby hermetically sealing cavity 40 and the active and passive elements mounted therein.

The present invention mounting structure provides an improved package for microwave semiconductor devices which is substantially improved over those described in the prior art. The characteristics of the present invention mounting structure provides improved high frequency operation, improved spacial characteristics for mounting impedance matching elements, low thermal impedance, non-use of magnetic materials and ability to provide a hermetic chamber without the use of organic compounds.

I claim:

1. A mounting structure for supporting a semiconductor device having at least two active regions comprising:

a. an electrically conductive header;

b. a thermally conductive member having top and bottom surfaces and having a plurality of apertures therethrough from the top to the bottom surface thereof, said thermally conductive member being coupled to said conductive header to provide a good thermal path for said semiconductor device, said semiconductor device being mounted upon and in good thermal contact with said thermally conductive member;

c. first, second and third metallized regions disposed on the top surface of said thermally conductive member, each of said first, second and third metallized regions being in communication with one of said apertures, said first, second and third metallized regions being electrically insulated from each other, one region thereof being adapted to receive the semiconductor device;

d. fourth, fifth and sixth metallized regions disposed on the bottom surface of said thermally conductive member, each being in communication with one of said apertures, said fourth, fifth and sixth metallized regions being electrically insulated from each other and in electrical contact with said first, second and third metallized regions respectively; and e. hermetic sealing means secured to the top surface of said thermally conductive member for forming a hermetic cavity about said first, second and third metallized regions and the semiconductor device secured thereon during high temperature cycling; wherein each of said first and second metallized regions are bounded by and electrically insulated from said third metallized region, the semiconductor device being connected to said second metallized region and in electrical communication with said fifth metallized region, and including first and second contact leads each connected to one of said fifth and sixth metallized regions respectively.

2. A mounting structure for supporting a semiconductor device having at least two active regions comprising:

a. an electrically conductive header;

b. a thermally conductive member having top and bottom surfaces and having a plurality of apertures therethrough from the top to the bottom surface thereof, said thermally conductive member being coupled to said conductive header to provide a good thermal path for said semiconductor device, said semiconductor device being mounted upon and in good thermal contact with said thermally conductive member;

c. first, second and third metallized regions disposed on the top surface of said thermally conductive member, each of said first, second and third metallized regions being in communication with one of said apertures, said first, second and third metallized regions being electrically insulated from each other, one region thereof being adapted to receive the semiconductor device;

d. fourth, fifth and sixth metallized regions disposed on the bottom surface of said thermally conductive member, each being in communication with one of said apertures, said fourth, fifth and sixth metallized regions being electrically insulated from each other and in electrical contact with said first, second and third metallized regions respectively; and e. hermetic sealing means secured to the top surface of said thermally conductive member for forming a hermetic cavity about said first, second and third metallized regions and the semiconductor device secured thereon during high temperature cycling; wherein each of said first and second metallized regions are bounded by and electrically insulated from said third metallized region, the semiconductor device being connected to said second metallized region and in electrical communication with said fifth metallized region, and including first and second contact leads each connected to one of said fifth and sixth metallized regions respectively including a conductive spacer of substantially the same shape as said fourth metallized region connected intermediate said conductive header and said fourth metallized region on the bottom surface of said thermally conductive member, said conductive header being electrically connected to said first metallized region whereby said conductive header is adapted to be a ground plane.

3. A mounting structure for supporting a semiconductor device having at least two active regions, said mounting structure having an input, output and common terminal comprising:

a. an electrically conductive header;

b. a thermally conductive member having a top and bottom surface and having a plurality of apertures therethrough from said top to said bottom surface, said apertures being aligned in a pair of parallel, spaced configurations, the bottom surface of said thermally conductive member being coupled to said conductive header;

c. first, second and third metallized regions disposed on the top surface of said thermally conductive member, said second and third metallized regions being bounded by and electrically insulated from each other and from said first metallized region, each of said first, second and third metallized regions being integral with respective ones of said apertures;

d. fourth, fifth and sixth metallized regions disposed on the bottom surface of said thermally conductive member, said fifth and sixth metallized regions being adjacent edges of said thermally conductive member and being electrically insulated from each other and from said fourth metallized region, said fourth, fifth and sixth metallized regions being in electrical communication with said first, second and third metallized regions respectively, said fourth metallized region being connected to said conductive header;

e. means for coupling one of the active regions of the semiconductor device to said second metallized region;

f. hermetic sealing means coupled to the first metallized region of said thermally conductive member whereby a hermetic cavity is formed intermediate the top surface of said thermally conductive member and said hermetic sealing means; and g. first and second stripline contact leads coupled to said fifth and sixth metallized regions whereby said first and second contact leads form the input and output terminals of said mounting structure.

4. A mounting structure as defined in claim 3 wherein said thermally conductive member is fabricated from a ceramic.

5. A mounting structure as defined in claim 4 wherein said thermally conductive member is fabricated from beryllia.

6. A mounting structure as defined in claim 3 including impedance matching components secured to said first metallized region and connected to said semiconductor device within said hermetic cavity.

7. A mounting structure as defined in claim 3 wherein said coupling of said thermally conductive member and said conductive header comprises a metallized thermally conductive, electrically insulating member whereby said conductive header is electrically insulated from the metallized regions of said thermally conductive member.

* * * * *